(12) United States Patent
Nikitin et al.

(10) Patent No.: US 8,513,062 B2
(45) Date of Patent: Aug. 20, 2013

(54) METHOD OF MANUFACTURING A SEMICONDUCTOR DEVICE WITH A CARRIER HAVING A CAVITY AND SEMICONDUCTOR DEVICE

(75) Inventors: Ivan Nikitin, Regensburg (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 517 days.

(21) Appl. No.: 12/706,555

(22) Filed: Feb. 16, 2010

(65) Prior Publication Data
US 2011/0198743 A1  Aug. 18, 2011

(51) Int. Cl.
*H01L 21/00* (2006.01)
(52) U.S. Cl.
USPC .......................................... 438/119; 438/110
(58) Field of Classification Search
USPC .......................................... 438/110–112, 119
See application file for complete search history.

(56) References Cited

U.S. PATENT DOCUMENTS

| | | | |
|---|---|---|---|
| 6,020,218 A * | 2/2000 | Shim et al. | 438/111 |
| 2001/0048156 A1 | 12/2001 | Fukuizumi | |
| 2003/0015342 A1* | 1/2003 | Sakamoto et al. | 174/250 |
| 2004/0266037 A1 | 12/2004 | Knapp et al. | |
| 2006/0060891 A1 | 3/2006 | Pavier | |
| 2006/0110853 A1* | 5/2006 | Chen et al. | 438/110 |
| 2008/0251903 A1 | 10/2008 | Otremba et al. | |
| 2009/0227071 A1* | 9/2009 | Otremba et al. | 438/113 |
| 2011/0031602 A1* | 2/2011 | Wowra et al. | 257/690 |

FOREIGN PATENT DOCUMENTS

DE  10 2007 017 831 A1  10/2008

* cited by examiner

*Primary Examiner* — Jenny L Wagner
(74) *Attorney, Agent, or Firm* — Slater & Matsil, L.L.P.

(57) ABSTRACT

A method includes providing a carrier having a first cavity, providing a dielectric foil with a metal layer attached to the dielectric foil, placing a first semiconductor chip in the first cavity of the carrier, and applying the dielectric foil to the carrier.

21 Claims, 7 Drawing Sheets

METHOD OF MANUFACTURING A SEMICONDUCTOR DEVICE WITH A CARRIER HAVING A CAVITY AND SEMICONDUCTOR DEVICE

TECHNICAL FIELD

This invention relates to a method of manufacturing a semiconductor device with a carrier having a cavity and a semiconductor device.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated in wafers, which are then singulated to produce semiconductor chips. One or more semiconductor chips are placed in a package to protect them from environmental and physical stresses. Packaging semiconductor chips increases the cost and complexity of manufacturing semiconductor devices because the packaging designs not only provide protection, they also permit transmission of electrical signals to and from the semiconductor chips and, in particular, removal of heat generated by the semiconductor chips.

For these and other reasons there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION OF ILLUSTRATIVE EMBODIMENTS

Figure 1A:
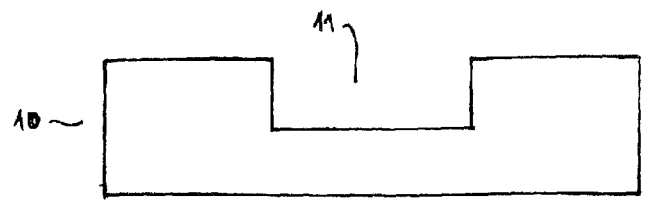
FIGS. 1A-1D schematically illustrate a cross-sectional view of one embodiment of a method of manufacturing a device including providing a carrier having a cavity, placing a semiconductor chip in the cavity, and applying a dielectric foil to the carrier.

In the following detailed description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

Devices containing one or more semiconductor chips are described below. The semiconductor chips may be of different types, may be manufactured by different technologies and may include, for example, integrated electrical, electro-optical or electro-mechanical circuits and/or passives. The semiconductor chips may, for example, be configured as power semiconductor chips, such as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. Furthermore, the semiconductor chips may include control circuits, microprocessors or microelectromechanical components. In particular, semiconductor chips having a vertical structure may be involved, that is to say that the semiconductor chips may be fabricated in such a way that electric currents can flow in a direction perpendicular to the main faces of the semiconductor chips. A semiconductor chip having a vertical structure may have contact elements, in particular, on its two main surfaces, that is to say on its top side and bottom side. In particular, power semiconductor chips may have a vertical structure. By way of example, the source electrode and gate electrode of a power MOSFET may be situated on one main surface, while the drain electrode of the power MOSFET is arranged on the other main surface. Furthermore, the devices described below may include integrated circuits to control the integrated circuits of other semiconductor chips, for example, the integrated circuits of power semiconductor chips. The semiconductor chips need not be manufactured from specific semiconductor material, for example, Si, SiC, SiGe, GaAs, GaN, and, furthermore, may contain inorganic and/or organic materials that are not semiconductors, such as, for example, insulators, plastics or metals.

The semiconductor chips may have electrodes (or contact elements or contact pads) which allow electrical contact to be made with the integrated circuits included in the semiconductor chips. One or more metal layers may be applied to the electrodes of the semiconductor chips. The metal layers may be manufactured with any desired geometric shape and any desired material composition. The metal layers may, for example, be in the form of a layer covering an area. Any desired metal or metal alloy, for example, from aluminum, titanium, gold, silver, copper, palladium, platinum, nickel, chromium or nickel vanadium, may be used as the material. The metal layers need not be homogenous or manufactured from just one material, that is to say various compositions and concentrations of the materials contained in the metal layers are possible.

The semiconductor chips may be placed on carriers. The carriers may be of any shape, size or material. According to one embodiment, the carriers may be electrically conductive. They may be fabricated from metals or metal alloys, in particular, copper, copper alloys, iron nickel, aluminum, aluminum alloys, or other appropriate materials. According to one embodiment, the carriers may be entirely made of a metal or a metal alloy. The carriers may be metal plates or metal foils. The carriers may be unstructured or structured and may be, for example, a leadframe or a part of a leadframe. Furthermore, the carriers may be plated with an electrically conductive material, for example, copper, silver, iron nickel or nickel phosphorus.

The carriers may have one or more cavities (or depressions or recesses). The cavities may be formed in the carrier by etching, mechanical processing or any other appropriate technique. The cavities may have any shape and size. The cavities may have at least one base surface on which a semiconductor chip can be placed. This base surface may be essentially coplanar with one or both main surfaces of the carrier. The side walls of the cavities may be essentially orthogonal to the main surfaces of the carrier or, alternatively, may form any other angle. In particular, the angle formed by at least one side wall of the cavity and the main surface of the carrier in which the cavity is formed may be smaller than 90° and, in particular, may be in the range between 60° and 85°. The main surface of the carrier, in which the cavity is formed, may overlap portions of the base surface of the cavity such that the cavity forms an undercut cavity.

The devices may include a dielectric layer. The dielectric layer may cover any fraction of any number of surfaces of the components of the device. The dielectric layer may serve various functions. It may be used, for example, to electrically insulate components of the device from each other and/or from external components, but the dielectric layer may also be used as a platform to mount other components, for example, wiring layers. The dielectric layer may be used to produce fan-out type packages. In a fan-out type package at least some of the external contact elements and/or conductor tracks connecting the semiconductor chip to the external contact elements are located laterally outside of the outline of the semiconductor chip or do at least intersect the outline of the semiconductor chip. Thus, in fan-out type packages, a peripherally outer part of the package of the semiconductor chip is typically (additionally) used for electrically bonding the package to external applications, such as application boards and others. This outer part of the package encompassing the semiconductor chip effectively enlarges the contact area of the package in relation to the footprint of the semiconductor chip, thus leading to relaxed constraints in view of package pad size and pitch with regard to later processing, e.g., second level assembly.

The dielectric layer may, for example, be provided as a dielectric foil (or dielectric sheet) and may be laminated on the components of the device. The dielectric foil may be made of a polymer, such as epoxide, acrylate or a thermoplastic or thermosetting material. According to one embodiment, the dielectric foil may, for example, be made of a filled or unfilled prepreg (short for preimpregnated fibers) that is a combination of a fiber mat, for example, glass or carbon fibers, and a resin, for example, a duroplastic material. Prepreg materials are usually used to manufacture PCBs (printed circuit boards). Well known prepreg materials that are used in PCB industry and that can be used here as the dielectric material are: FR-2, FR-3, FR-4, FR-5, FR-6, G-10, CEM-1, CEM-2, CEM-3, CEM-4 and CEM-5. Instead of lamination, the dielectric material may also be deposited by printing or from a gas phase or a solution or by compression molding, injection molding, powder molding, potting, dispensing, jetting or any other appropriate method. The dielectric material may, for example, be any appropriate thermoplastic or thermosetting material.

One or more metal layers may be attached to the dielectric layer. The metal layers may, for example, be used to produce a redistribution layer. The metal layers may be used as wiring layers to make electrical contact with the semiconductor chips from outside the devices or to make electrical contact with other semiconductor chips and/or components contained in the devices. The metal layers may be manufactured with any desired geometric shape and any desired material composition. The metal layers may, for example, be composed of conductor tracks, but may also be in the form of a layer covering an area. Any desired metals, for example, copper, aluminum, nickel, palladium, silver, tin or gold, metal alloys or metal stacks may be used as the material. The metal layers need not be homogenous or manufactured from just one material, that is to say various compositions and concentrations of the materials contained in the metal layers are possible. The metal layer may be attached to the dielectric foil before the dielectric foil is applied to the carrier. The metal layer and the dielectric foil may be provided as a resin-coated-copper (RCC) foil.

The devices described below include external contact elements, which may be of any shape, size and material. The external contact elements may be accessible from outside the device and may thus allow electrical contact to be made with the semiconductor chips from outside the device. Furthermore, the external contact elements may be thermally conductive and may serve as heat sinks for dissipating the heat generated by the semiconductor chips. The external contact elements may be composed of any desired electrically conductive material. The external contact elements may include external contact pads. Solder material may be deposited on the external contact pads.

Figure 1B:
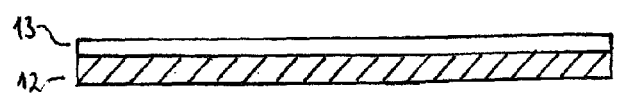
Figure 1C:
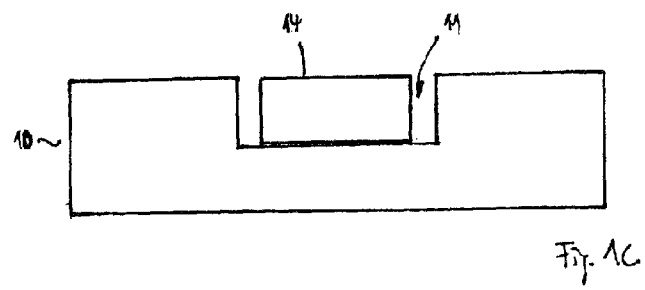
Figure 1D:
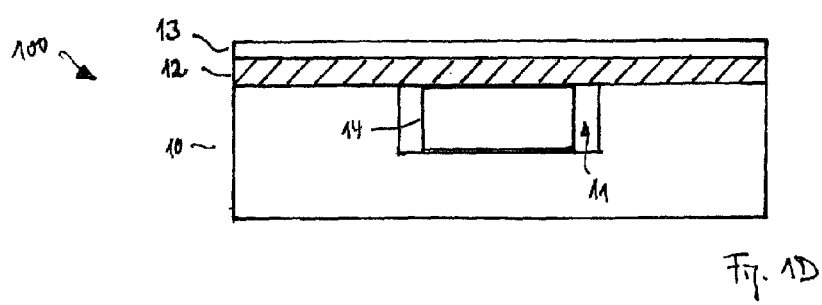

FIGS. 1A-1D schematically illustrate a cross-sectional view of one embodiment of a method of manufacturing a device 100, which is illustrated in FIG. 1D. As illustrated in FIG. 1A, a carrier 10 is provided which includes a first cavity 11. Furthermore, a dielectric foil 12 with a metal layer 13 attached to the dielectric foil 12 is provided as illustrated in FIG. 1B. A first semiconductor chip 14 is placed in the first cavity 11 of the carrier 10 as illustrated in FIG. 1C. Then the dielectric foil 12 together with the metal layer 13 is applied to the carrier 10 as illustrated in FIG. 1D.

Figure 2:
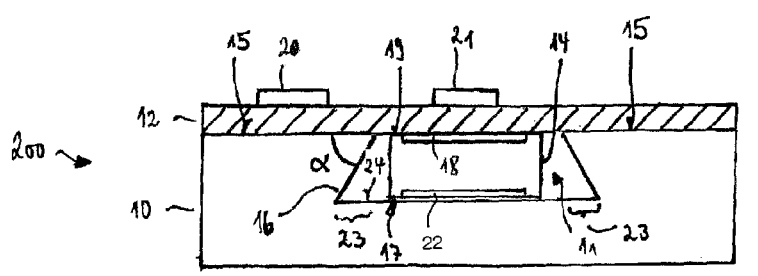
FIG. 2 schematically illustrates a cross-sectional view of one embodiment of a device including a semiconductor chip mounted on a carrier with a cavity formed in the carrier having a re-entrant angle.

FIG. 2 schematically illustrates a cross-sectional view of a device 200. The device 200 includes a metal carrier 10 with a cavity (or recess or depression) 11 formed in a main surface 15 of the carrier 10. The cavity 11 may form an undercut such that the main surface 15 of the carrier 10 overlaps a portion 23 of a base surface 24 of the cavity 11. According to one embodiment, an angle α that is formed between the main surface 15 of the carrier 10 and a side wall 16 of the cavity 11 has a value in the range between 60° and 85°. A semiconductor chip 14 is placed on the base surface 24 of the cavity 11. The semiconductor chip 14 includes a first electrode 22 on a first surface 17 of the semiconductor chip 14 and a second electrode 18 on a second surface 19 of the semiconductor chip 14. The second surface 19 is located opposite to the first surface 17. The semiconductor chip 14 is placed in the cavity 11 such that its first surface 17 faces the carrier 10. A dielectric layer 12 is placed over the carrier 10 and the semiconductor chip 14. External contact elements 20 and 21 are placed over the dielectric layer 12. The external contact element 20 is electrically coupled to the first electrode 22 of the semiconductor chip 14, and the external contact element 21 is electrically coupled to the second electrode 18 of the semiconductor chip 14.

Figure 3A:
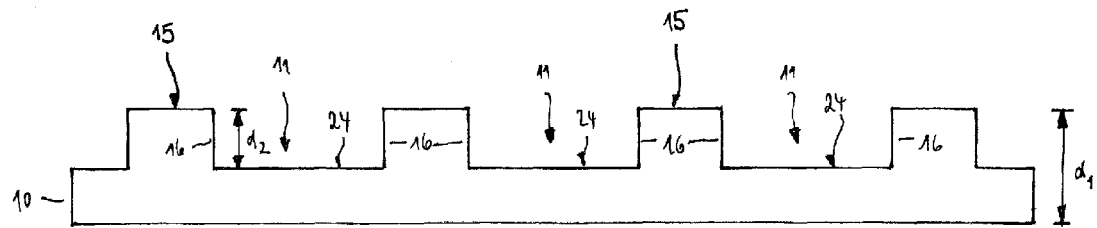
FIGS. 3A-3H schematically illustrate a cross-sectional view of one embodiment of a method of manufacturing a device including providing a carrier having a plurality of cavities, placing a plurality of semiconductor chip in the cavities, applying a dielectric foil to the carrier, and singulating the carrier.
Figure 3B:
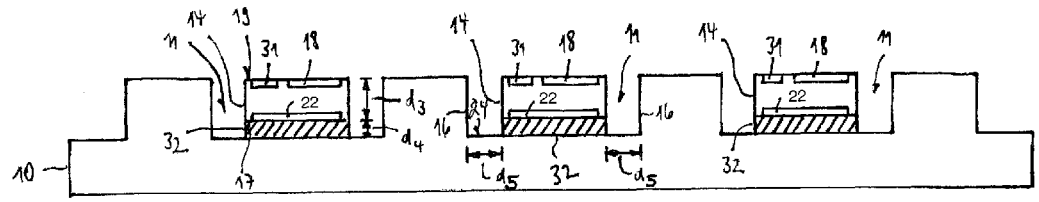
Figure 3C:
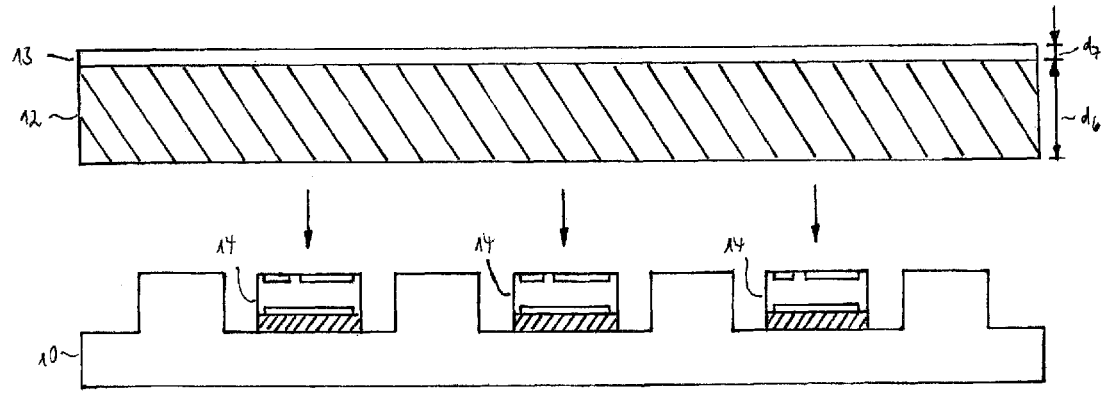
Figure 3D:
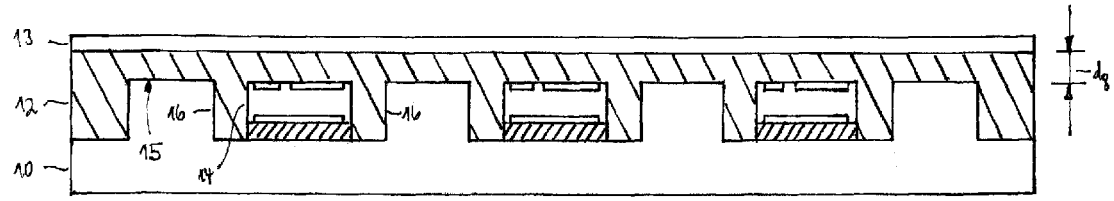
Figure 3E:
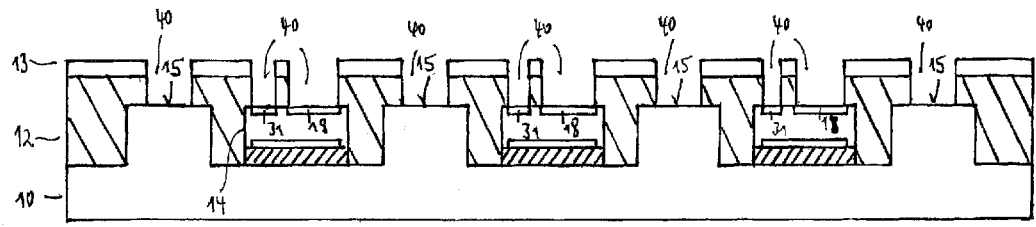
Figure 3F:
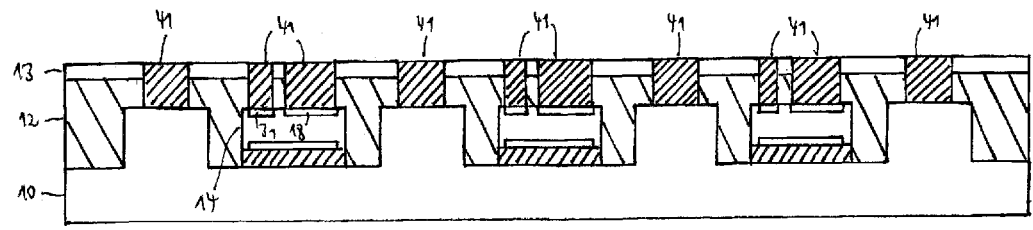
Figure 3G:
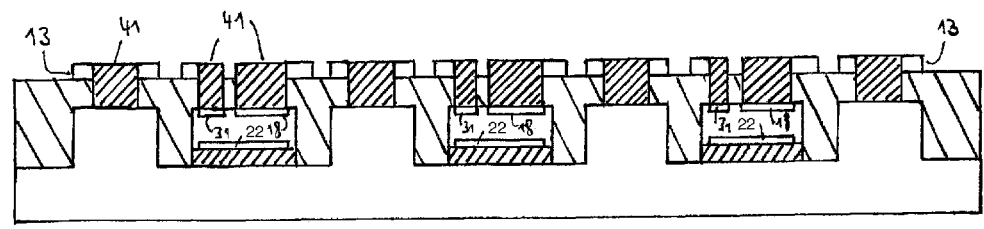
Figure 3H:
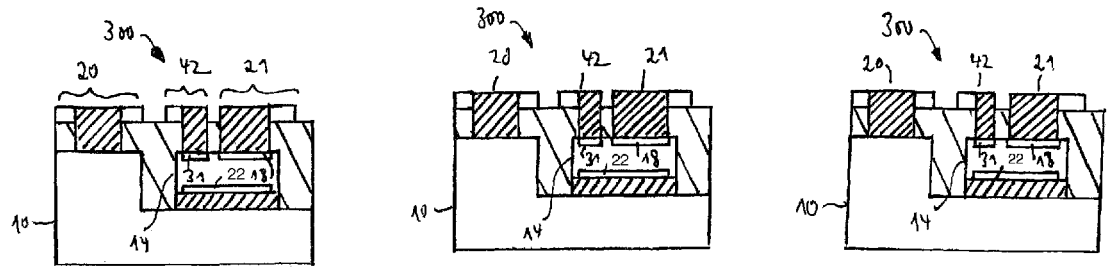

FIGS. 3A-3H, collectively FIG. 3, schematically illustrate a cross-sectional view of one embodiment of a method of manufacturing a device 300, which is illustrated in FIG. 3H. The method that is illustrated in FIGS. 3A-3H is an implementation of the method illustrated in FIGS. 1A-1D. The details of the method that are described below can therefore be likewise applied to the method of FIGS. 1A-1D. Similar or identical components of the devices 100 and 300 are denoted by the same reference numerals.

As illustrated in FIG. 3A, a carrier 10 is provided. The carrier 10 may be a plate or a foil made of a rigid material, for example, a metal or a metal alloy, such as copper, aluminum, nickel, CuFeP, steel or stainless steel. The carrier 10 may be electrically conductive and may be a leadframe. Moreover, the carrier 10 may be plated with an electrically conductive material, for example copper, silver, iron nickel or nickel phosphorus. The shape of the carrier 10 is not limited to any geometric shape, and the carrier 10 may have any appropriate size. The carrier 10 may have a flat upper main surface 15. The thickness $d_1$ of the carrier 10 (measured in a direction orthogonal to the main surface 15) may be in the range from 100 μm to several millimeter.

A plurality of cavities (or recesses or depressions) 11 may be formed in the carrier 10. Each of the cavities 11 may extend from the upper main surface 15 of the carrier 10 into the carrier 10. Although in the embodiment of FIG. 3, a first, a second and a third cavity 11 are illustrated, any number of cavities 11 may be formed in the carrier 10. Each of the cavities 11 has side walls 16 surrounding the respective cavity 11 and a base surface 24. The base surfaces 24 may be essentially planar surfaces and may be coplanar to the main surface 15 of the carrier 10. The height $d_2$ of the cavities 11 may be in the range from 5 to 400 μm and, in particular, in the range from 40 to 100 μm. The height $d_2$ may be the distance between the main surface 15 of the carrier 10 and the base surface 24 of the cavity 11 measured in a direction orthogonal to the main surface 15. The height $d_2$ may be in the range of $d_1/2$. The cavities 11 may be formed in the carrier 10 by pressing, punching, stamping, sawing, cutting, milling, etching or other appropriate techniques.

A plurality of semiconductor chips 14 may be placed in the cavities 11 as illustrated in FIG. 3B. Although in the embodiment of FIG. 3B a first, a second and a third semiconductor chip 14 are illustrated, any number of the semiconductor chips 14 may be placed in the cavities 11 of the carrier 10. The semiconductor chips 14 are relocated on the carrier 10 in larger spacing as they have been in the wafer bond. The semiconductor chips 14 may have been manufactured on the same semiconductor wafer, but may alternatively have been manufactured on different wafers. Furthermore, the semiconductor chips 14 may be physically identical, but may also contain different integrated circuits and/or represent other components and/or may have different outer dimensions and/or geometries. The semiconductor chips 14 may have a thickness $d_3$ in the range between 40 μm and several hundred micrometers, in particular, in the range between 50 and 100 μm. The semiconductor chips 14 may be placed over the base surfaces 24 of the cavities 11 with their first surfaces 17 facing the base surfaces 24 and their second surfaces 19 opposite to the first surfaces 17 facing away from the base surfaces 24.

Each of the semiconductor chips 14 may have a first electrode 22 on the first surface 17 and a second electrode 18 on the second surface 19. The first and second electrodes 22, 18 may be load electrodes. Furthermore, each of the semiconductor chips 14 may have a third electrode 31 on its second surface 19 functioning as a control electrode. The semiconductor chips 14 may be configured as vertical power semiconductor chips and may include power diodes or power transistors, for example, power MOSFETs, IGBTs, JFETs or power bipolar transistors. In the case of a power MOSFET or a JFET, the first load electrode 22 is a drain electrode, the second load electrode 18 is a source electrode, and the control electrode 31 is a gate electrode. In the case of an IGBT, the first load electrode 22 is a collector electrode, the second load electrode 18 is an emitter electrode, and the control electrode 31 is a gate electrode. In the case of a power bipolar transistor, the first load electrode 22 is a collector electrode, the second load electrode 18 is an emitter electrode, and the control electrode 31 is a base electrode. In case of a power diode, the first and second load electrodes 22 and 18 are cathode and anode, respectively. During operation, voltages of up to 5, 50, 100, 500 or 1000 V or even higher may be applied between the load electrodes 16 and 18. The switching frequency applied to the control electrode 31 may be in the range from 1 kHz to several GHz.

The first electrodes 22 of the semiconductor chips 14 may be firmly attached and electrically coupled to the metal carrier 10. For this purpose, an electrically conductive material 32 may be used, which may, for example, be a solder material, an electrically conductive adhesive or a paste containing metal particles. The electrical connections may, for example, be produced by diffusion soldering, soft soldering, adhesive bonding by means of an electrically conductive adhesive or sintering of (nano-) metal particles.

If diffusion soldering is used as a connecting technique, it is possible to use solder materials 32 which lead to intermetallic phases after the end of the soldering operation at the interface between the carrier 10 and the respective semiconductor chip 14 on account of interface diffusion processes. In this process, the solder material 32 is completely transformed, i.e., it passes completely into the intermetallic phase. Furthermore, a soft soldering process may be performed in order to attach the semiconductor chips 14 to the carrier 10. If soft soldering is used as a connection technique, a layer of the solder material 32 remains at the interface between the semiconductor chip 14 and the carrier 10. Solder materials 32 which may be used for the soldering process include, for example, Sn, AuSn, AgSn, CuSn, AgIn, AuIn, CuIn, AuSi or Au.

If the semiconductor chips 14 are adhesively bonded to the carrier 10, it is possible to use electrically conductive adhesives 32 which may be based on filled or unfilled polyimides, epoxy resins, acrylate resins, silicone resins or mixtures thereof and be enriched with gold, silver, nickel or copper in order to produce the electrical conductivity.

According to one embodiment, a paste containing (nano-) metal particles is used for attaching the semiconductor chips 14 to the carrier 10. The metal particles may, for example, be made of silver, gold, copper, tin or nickel. The extensions (average diameter) of the metal particles may be smaller than 100 nm and, in particular, smaller than 50 nm or 10 nm or 5 nm. It may also be provided that only a fraction of the metal particles has such dimensions. For example, at least 10% or 20% or 30% or 40% or 50% or 60% or 70% of the metal particles may have dimensions smaller than 100 nm or 50 nm or 10 nm or 5 nm. The other metal particles may have larger dimensions. The metal particles may be coated with a layer of an organic material or a flux material, for example, colophony. Furthermore, the metal particles may be dispersed in a suitable liquid or solvent.

After the placement of the semiconductor chips 14 on the carrier 10, the paste containing the metal particles may be exposed to a temperature $T_1$, which is high enough that the solvent and the layers coating the metal particles sublimate or evaporate. Furthermore, the temperature $T_1$ may be lower than the melting temperature of the metal of which the metal particles are made, but the temperature $T_1$ may be high enough to initiate a sintering process of the metal particles. After the solvent and the coating layers are removed, the metal particles may thus form a solid layer 32 due to their sintering as illustrated in FIG. 3B. The sinter layer 32 is electrically conductive. The temperature $T_1$ may be in the range from 150 to 450° C., in particular in the range from 180 to 300° C. and may depend on the material of the metal particles. During the sinter process the semiconductor chips 14 may be pressed towards the carrier 10.

After finishing the soldering, gluing or sintering process, the layer of the electrically conductive material 32 may have a thickness $d_4$ in the range between 1 and 40 µm. In the case of diffusion soldering, the thickness $d_4$ may be close to zero or even zero. The height $d_2$ of the cavities 11 may essentially be equal to the thickness $d_3$ of the semiconductor chip 14 plus the thickness $d_4$ of the electrically conductive material 32, i.e., $d_2 = d_3 + d_4$. Moreover, the height $d_2$ may deviate from the sum of $d_3$ and $d_4$ for up to ±20 µm, i.e., $d_3+d_4<20$ µm$<d_2<d_3+d_4+20$ µm, or, according to one embodiment, for up to ±10 µm, i.e., $d_3+d_4-10$ µm$<d_2<d_3+d_4+10$ µm or, according to one embodiment, for up to ±5 µm, i.e., $d_3+d_4-5$ µm$<d_2<d_3+d_4+5$ µm.

After the placement of the semiconductor chips 14 in the cavities 11, there may be gaps between the side surfaces of the semiconductor chips 14 and the respective side walls 16 of the cavities 11. The widths $d_5$ of these gaps may be in the range from 20 to 200 µm.

As illustrated in FIG. 3C, a dielectric foil (or sheet) 12 may be provided with a metal layer 13 attached to one surface of the dielectric foil 12. The dielectric foil 12 may then be placed over the carrier 10 and the semiconductor chips 14 with the metal layer 13 facing away from the carrier 10. The dielectric foil 12 may encapsulate the semiconductor chips 14 as illustrated in FIG. 3D. The dielectric foil 12 may be laminated on top of the carrier 10 as well as the semiconductor chips 14. Heat and/or pressure may be applied for a time suitable to attach the dielectric foil 12 to the underlying structure. For example, a temperature in the range between 100 and 200° C. and, in particular, in the range between 140 and 160° C. may be used for the lamination process. The gaps between the semiconductor chips 14 and the respective side walls 16 of the cavities 11 may also filled with the dielectric foil 12.

The dielectric foil 12 may be made of an electrically insulating material, for example, a polymer material, such as epoxide, acrylate or a thermoplastic or thermosetting material. According to one embodiment, the polymer material may be a prepreg material that is a combination of a fiber mat, for example, glass or carbon fibers, and a resin, for example a duroplastic material. Prepreg materials are usually used to manufacture PCBs. Well known prepreg materials that are used in PCB industry and that can be used here as the polymer material are: FR-2, FR-3, FR-4, FR-5, FR-6, G-10, CEM-1, CEM-2, CEM-3, CEM-4 and CEM-5. Prepreg materials are bi-stage materials, which are flexible when applied over the semiconductor chips 14 and hardened during a heat-treatment. For the lamination of the prepreg the same or similar process steps can be used as in PCB manufacturing. Furthermore, the dielectric layer 12 together with the metal layer 13 may be a resin-coated-copper (RCC) foil. The metal layer 13 may be made of an appropriate metal or metal alloy, such as copper or aluminum. Before attaching the dielectric foil 12 to the carrier 10 and the semiconductor chips 14, the dielectric foil 12 may have a thickness $d_6$ in the range between 50 and 200 µm and, in particular, in the range from 80 to 120 µm, but may also be outside these ranges. The thickness $d_7$ of the metal layer 13 may be in the range between 5 and 20 µm. After finishing the lamination process, the distance $d_8$ between the upper main surface 15 of the carrier 10 and the upper surface of the dielectric layer 12 (or the lower surface of the metal layer 13) may be in the range between 10 and 50 µm.

Instead of lamination, the dielectric layer 12 may be deposited by printing or from a gas phase or a solution or by compression molding, injection molding, powder molding, potting, dispensing, jetting or any other appropriate method.

The dielectric layer 12 together with the metal layer 13 may be structured as illustrated in FIG. 3E. A plurality of cutouts or through-holes 40 are created in the metal layer 13 and the dielectric layer 12 to expose at least portions of the second electrodes 18 and the control electrodes 31 of the semiconductor chips 14 as well as portions of the upper main surface 15 of the carrier 10 so that electrical connections can be made to those exposed regions. The metal layer 13 and the dielectric layer 12 may be structured by applying an etching mask to the upper surface of the metal layer 13 and subsequent wet chemical etching of the portions of the metal layer 13 and the underlying dielectric layer 12 that are exposed from the etching mask. Thereafter the etching mask may be stripped off by using an appropriate solvent. Instead of chemical etching, laser ablation (laser drilling) may be employed to produce the through-holes 40 in the metal layer 13 and the dielectric layer 12.

If the height $d_2$ of the cavities 11 is similar to the thickness $d_3$ of the semiconductor chips 14 plus the thickness $d_4$ of the layer of the electrically conductive material 32, i.e. $d_2 \sim d_3+d_4$, all through-holes 40 have about the same height. This makes it easier to produce the through-holes 40, in particular, if laser ablation is employed to produce the through-holes 40. Moreover, it may be provided that all through-holes 40 have the same width (in a direction parallel to the main surface 15 of the carrier 10). This further simplifies the production of the through-holes 40, especially in case of laser ablation.

The through-holes 40 may be filled with an electrically conductive material 41, for example, a metal or metal alloy, as illustrated in FIG. 3F. The electrically conductive material 41 may, for example, be deposited by a galvanic deposition process. Thereby the carrier 10 and the electrodes 18, 31 may be used as electrodes for the electrochemical deposition of an appropriate metal or metal alloy, for example, copper. Furthermore, the through-holes 40 may be filled with a paste containing metal particles. It may be sufficient to cover only the walls of the through-holes 40 with the electrically conductive material 41, however the through-holes 40 may also be completely filled. The electrically conductive material 41 produces an electrical coupling of the carrier 10 and the electrodes 18, 31 to the metal layer 13.

As illustrated in FIG. 3G, the metal layer 13 may be structured in order to produce the footprint of the devices 300. For this purpose, a photostructurable resist film may be laminated on the top of the metal layer 13 and the upper surface of the electrically conductive material 41. Recesses may be formed in the resist film by exposure to light having a suitable wave-length. For that, a laser beam or light exposure through a mask may be employed. Subsequently, the resist film is developed and the thereby exposed portions of the metal layer 13 are etched. Afterwards the resist film is stripped off, and the structured metal layer 13 remains on the dielectric layer 12 as illustrated in FIG. 3G.

As illustrated in FIG. 3H, the devices 300 are separated from one another by separation of the carrier 10 and the dielectric layer 12. Singulation of the devices 300 may be carried out, for example, by sawing, cutting, milling, laser ablation or etching. In the devices 300 the structured metal layer 13 and the electrically conductive material 41 filling the through-holes 40 serve as a redistribution layer and forms external contact elements 20, 21 and 42, which are electrically coupled to the first electrode 22 (via the electrically conductive carrier 10), the second electrode 18 and the control electrode 31 of the semiconductor chip 14, respectively. The upper surface of the metal layer 13 is a mounting surface which can be used to mount the device 300 on another components, for example, a circuit board.

The devices 300 manufactured by the method described above are fan-out type packages. The dielectric layer 12 allows the redistribution layer to extend beyond the outline of the semiconductor chip 14. The external contact elements 20, 21 and 42 therefore do not need to be arranged within the outline of the semiconductor chip 14 but can be distributed over a larger area. The increased area which is available for arrangement of the external contact elements 20, 21 and 42 as a result of the dielectric layer 12 means that the external contact elements 20, 21 and 42 cannot only be arranged at a great distance from one another, but that the maximum number of external contact elements 20, 21 and 42 which can be arranged there is likewise increased compared to the situation when all the external contact elements 20, 21 and 42 are arranged within the outline of the semiconductor chip 14.

It is obvious to a person skilled in the art that the devices 300 illustrated in FIG. 3H and the manufacturing thereof as described above are only intended to be an exemplary embodiment, and many variations are possible. For example, further semiconductor chips or passives of different types may be included in the same device 300. The semiconductor chips and passives may differ in function, size, manufacturing technology etc.

According to one embodiment, the dielectric foil 12 may be laminated over the carrier 10 and the semiconductor chips 14 without the metal layer 13 attached to the dielectric foil 12. The metal layer 13 may be deposited over the dielectric foil 12 after the lamination process.

Figure 4A:
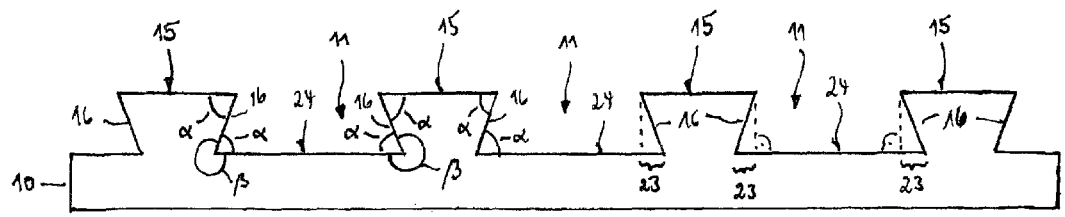
FIGS. 4A-4C schematically illustrate a cross-sectional view of a variation of the method illustrated in FIGS. 3A-3H.
Figure 4B:
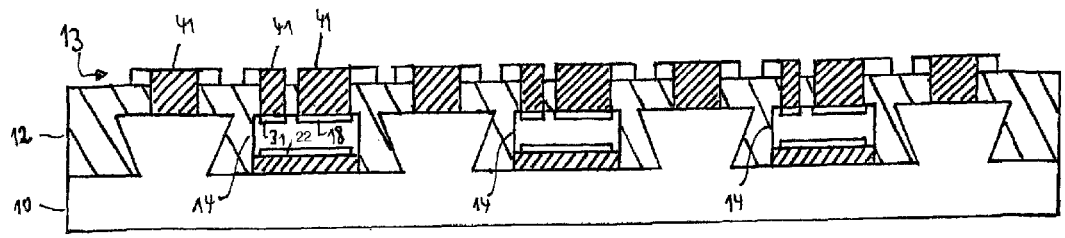
Figure 4C:
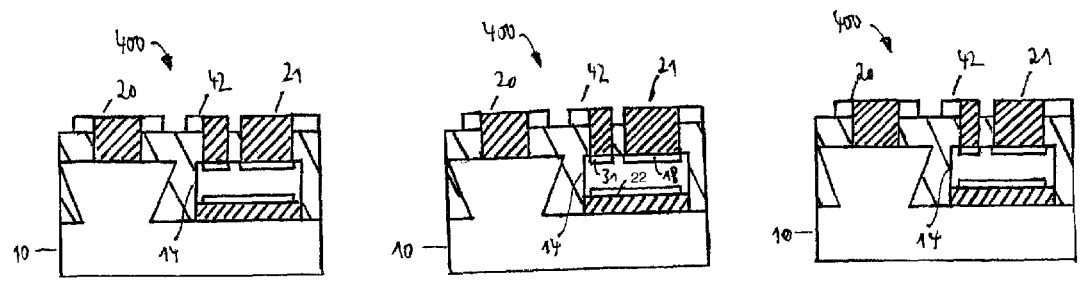

In the embodiment shown in FIGS. 3A-3H the side walls 16 of the cavities 11 are essentially orthogonal to the upper main surface 15 of the carrier 10. FIGS. 4A-4C schematically illustrate a cross-sectional view of one embodiment of a method of manufacturing a device 400 where the side walls 16 of the cavities 11 in the metal carrier 10 are not orthogonal to the upper main surface 15 of the carrier 10. Instead, the side walls 16 of the cavities 11 are formed such that the main surface 15 of the carrier 10 overlaps portions 23 of the base surface 24 of the cavities 11. In one embodiment, an angle α in the range between 60° and 85° and, in particular, between 70° and 80° is formed between the main surface 15 of the carrier 10 and each of the side walls 16, which surround the respective cavity 11. Since the base surfaces 24 of the cavities 11 are essentially coplanar to the upper main surface 15 of the carrier 10, each base surface 24 and each of the respective side walls 16 also form the angle α. As illustrated in FIG. 4A, an angle β=360°−α is a re-entrant angle due to the arrangement of the side walls 16 and the apex of the angle β faces into the carrier 10. All other parameters of the carrier 10 illustrated in FIG. 4A are identical to the corresponding parameters of the carrier 10 illustrated in FIG. 3A. The cavities 11 of the carrier 10 as illustrated in FIG. 4A may be produced by mechanical processing the carrier 10, for example, milling, cutting or stamping.

Moreover, the manufacturing steps illustrated in FIGS. 3B-3G can be applied to the carrier 10 of FIG. 4A, which leads to a workpiece as illustrated in FIG. 4B, where the semiconductor chips 14 are placed in the cavities 11 and the dielectric foil 12 together with the metal layer 13 is laminated onto the carrier 10 with subsequent structuring of the dielectric foil 12 and the metal layer 13 and filling the through-holes 40 with the electrically conductive material 41.

Thereafter the semiconductor chips 14 are separated from one another thereby creating devices 400 as illustrated in FIG. 4C by separation of the carrier 10 and the dielectric layer 12. Singulation of the devices 400 may be carried out, for example, by sawing, cutting, milling, laser ablation or etching. The devices 400 may be identical to the devices 300 with the exception of the different arrangement of the side walls 16. The undercut of the cavities 11 of the devices 400 may increase the mechanical attachment of the dielectric layer 12 to the carrier 10. The device 400 is an implementation of the device 200 illustrated in FIG. 2.

Figure 5A:
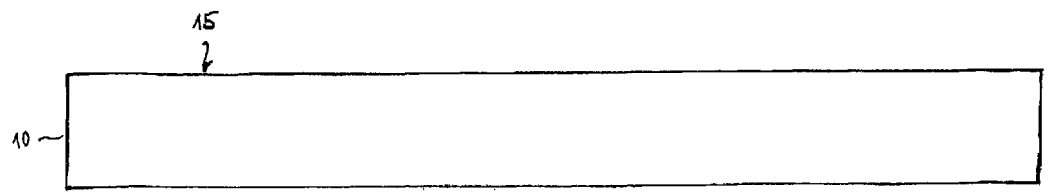
FIGS. 5A-5D schematically illustrate a cross-sectional view of one embodiment of a method of manufacturing a carrier having undercut cavities.
Figure 5B:
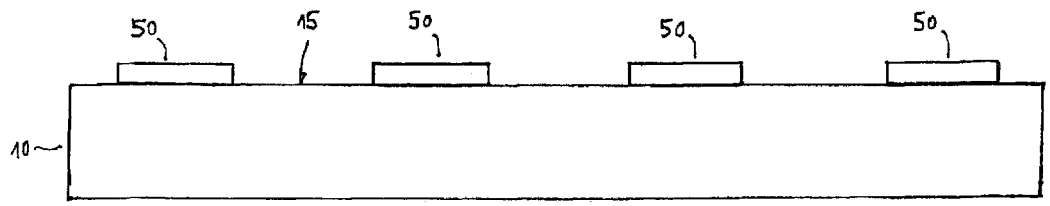

FIGS. 5A-5D schematically illustrate a cross-sectional view of one embodiment of a method of manufacturing a carrier 10 similar to the carrier 10 of FIG. 4A where the side walls 16 of the cavities 11 are not orthogonal to the upper main surface 15 of the carrier 10. Firstly a metal carrier 10 as illustrated in FIG. 5A is provided. In this state, the carrier 10 has an even main surface 15. Then an etching mask 50 is deposited on the upper main surface 15 of the carrier 10 as illustrated in FIG. 5B. For this purpose, a resist film 50 may be laminated on the main surface 15 of the carrier 10, which is photostructurable. Recesses may be formed in the resist film 50 by exposure to light having a suitable wave-length. For that, a laser beam or light exposure through a mask may be employed. Subsequently, the resist film is developed. The resist film 50 has then the shape as illustrated in FIG. 5B.

Figure 5C:
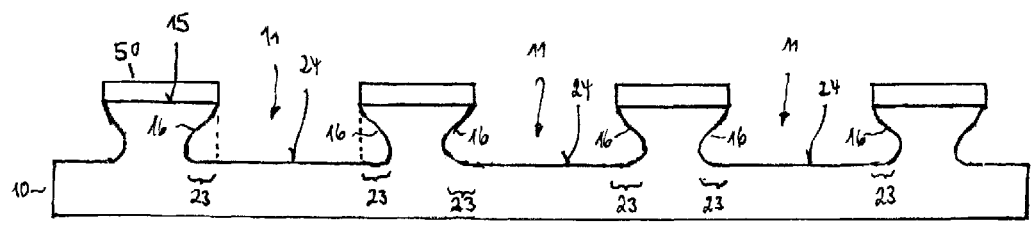
Figure 5D:
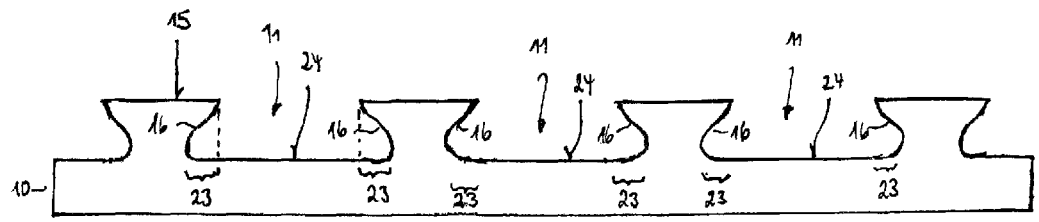

Subsequently, the upper main surface 15 of the carrier 10 may be exposed to an appropriate etching agent for a suitable time. Thereby the portions of the carrier 10 that are exposed from the etching mask 50 are etched and the cavities 11 are formed as illustrated in FIG. 5C. Due to the etching process, the side walls 16 of the cavities 11 have a curved surface rather than a planar surface. The cavities 11 are formed such that the main surface 15 of the carrier 10 overlaps portions of the base surface 24 of the cavities 11. Afterwards the resist film 50 is stripped off, and the structured carrier 10 is obtained as illustrated in FIG. 5D, which may be used to manufacture the devices 400 as illustrated in FIGS. 4A-4C.

Figure 6A:
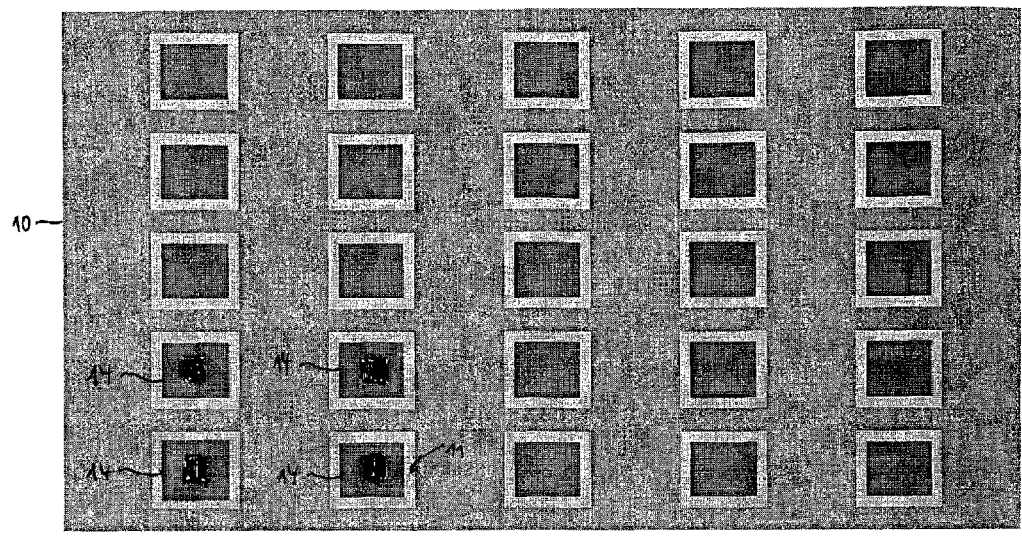
FIGS. 6A-6E schematically illustrate a cross-sectional view of a further variation of the method illustrated in FIGS. 3A-3H.

A further variation of the fabrication method illustrated in FIGS. 3A-3H is schematically illustrated in FIGS. 6A-6E. In FIG. 6A a metal carrier 10 is illustrated in a plan view (top) and a cross-sectional view (bottom). The carrier 10 includes a plurality of cavities 11, the side walls 16 of which may have the shape of the embodiment illustrated in FIG. 3A or the embodiment illustrated in FIG. 4A. In each of the cavities 11 a semiconductor chip 14 may be placed as described above in connection with FIG. 3B.

A first dielectric foil 12 with a metal layer 13 on top may be laminated over the carrier 10 and the semiconductor chips 14.

Figure 6B:

The same manufacturing steps may be carried out as illustrated in FIGS. 3C-3G and described above. The workpiece that is obtained from these manufacturing steps is illustrated in FIG. 6B. The metal layer 13 is structured and provides a first wiring layer (together with the through-holes 40 filled with the electrically conductive material 41) which electrically couples the semiconductor chips 14 to each other.

Figure 6C:
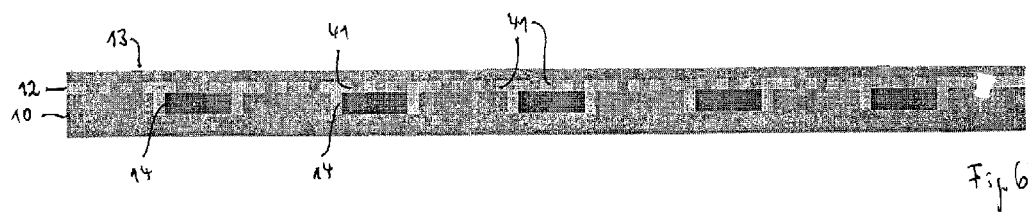

Subsequently, a second dielectric foil 12 with a second metal layer 13 on top may be laminated over the structured first dielectric foil 12 and the first metal layer 13. The same manufacturing steps may be carried out as illustrated in FIGS. 3C-3G and described above. The workpiece that is obtained from these manufacturing steps is illustrated in FIG. 6C. The structured second metal layer 13 provides a second wiring layer which electrically couples the semiconductor chips 14 with each other.

Figure 6D:
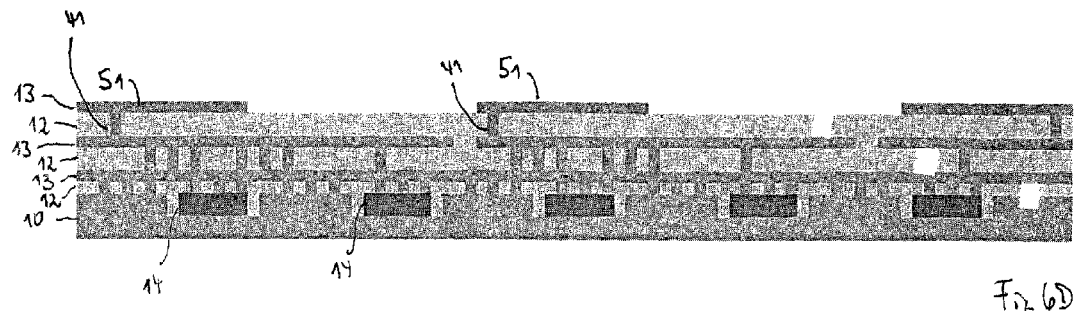

As illustrated in FIG. 6D, a third dielectric foil 12 with a third metal layer 13 on top may be laminated over the structured second dielectric foil 12 and the second metal layer 13. The third dielectric foil 12 and the third metal layer 13 may again be structured as described above to obtain external contact elements 51 on top of the workpiece. It may also be provided that further dielectric foils 12 and metal layers 13 are laminated onto the workpiece.

Figure 6E:
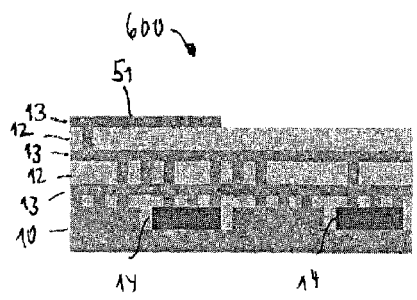
Figure 6E:
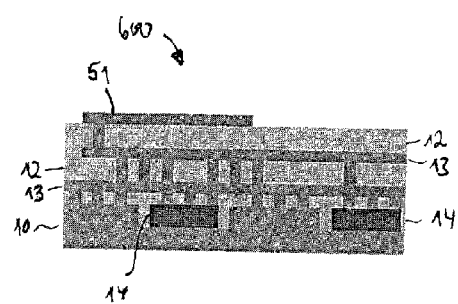

As illustrated in FIG. 6E, the devices 600 are separated from one another by separation of the carrier 10, the dielectric layers 12 and the metal layers 13. Singulation of the devices 600 may be carried out, for example, by sawing, cutting, milling, laser ablation or etching. Each of the devices 600 may contain a plurality of semiconductor chips 14, which are electrically coupled to each other via the structured metal layers 13. For example, each of the devices 600 may include one or more power semiconductor chips 14 and one or more logic chips 14. The logic chips 14 may be coupled to the power semiconductor chips 14, for example, to their control electrodes 31, such that the logic chips 14 can drive the power semiconductor chips 14.

Figure 7:
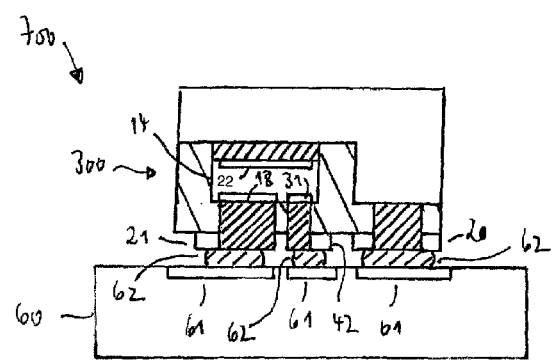
FIG. 7 schematically illustrates a cross-sectional view of one embodiment of a system including a device mounted on a circuit board.

FIG. 7 schematically illustrates a cross-sectional view of a system 700 including the device 300 mounted on a circuit board 60, for example, a PCB. The circuit board 60 includes contact pads 61 to which the external contact elements 20, 21 and 42 of the device 300 are soldered using solder deposits 62. On top of the device 300, a heat sink may be attached. Instead of the device 300, one of the devices 100, 200, 400 and 600 may be mounted on the circuit board 60.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
providing a carrier having a first cavity in a main surface of the carrier, wherein an angle formed between the main surface of the carrier and a side wall of the first cavity has a value between 60° and 85°;
providing a first dielectric foil with a first metal layer attached to the first dielectric foil;
placing a first semiconductor chip in the first cavity of the carrier; and
in a single step, applying the first dielectric foil with the first metal layer attached to the first dielectric foil to the carrier.

2. The method of claim 1, wherein the carrier has a second cavity, the method further comprising placing a second semiconductor chip in the second cavity.

3. The method of claim 2, further comprising separating the first semiconductor chip from the second semiconductor chip after applying the first dielectric foil to the carrier.

4. The method of claim 1, wherein applying the first dielectric foil to the carrier comprises laminating the first dielectric foil on the carrier.

5. The method of claim 1, wherein the carrier comprises an electrically conductive material.

6. The method of claim 1, wherein the first semiconductor chip comprises a first electrode on a first surface and a second electrode on a second surface opposite to the first surface, wherein the method further comprises placing the first semiconductor chip in the first cavity of the carrier wherein the first surface of the first semiconductor chip faces the carrier.

7. The method of claim 1, wherein the first metal layer faces away from the carrier when the first dielectric foil is applied to the carrier.

8. The method of claim 1, wherein the first dielectric foil fills a gap between the carrier and the first semiconductor chip.

9. The method of claim 1, wherein the first dielectric foil and the first metal layer are structured to create through-holes in the first dielectric foil and the first metal layer to expose a portion of the first semiconductor chip.

10. The method of claim 9, further comprising filling the through-holes in the first dielectric foil and the first metal layer with a metal or a metal alloy.

11. The method of claim 10, further comprising structuring the first metal layer after filling the through-holes with a metal or a metal alloy.

12. The method of claim 1, further comprising producing external contact elements from the first metal layer.

13. The method of claim 12, wherein the first semiconductor chip comprises a first electrode on a first surface and a second electrode on a second surface opposite to the first surface, the method further comprising placing the first semiconductor chip in the first cavity of the carrier with the first surface facing the carrier, wherein the first and second electrode of the first semiconductor chip are electrically coupled to the external contact elements.

14. The method of claim 1, wherein the first dielectric foil with the first metal layer attached to the first dielectric foil comprising a resin-coated-copper (RCC) foil.

15. The method of claim 1, wherein the first semiconductor chip is attached to the carrier by an electrically conductive material.

16. The method of claim 15, wherein the first semiconductor chip has a height $d_3$, the electrically conductive material has a height $d_4$, and the first cavity of the carrier has a height $d_2$, where $d_3+d_4-20\ \mu m<d_2<d_3+d_4+20\ \mu m$.

17. The method of claim 1, further comprising applying a second dielectric foil with a second metal layer attached to the second dielectric foil to the first dielectric foil with the first metal layer attached.

18. The method of claim 1, wherein placing the first semiconductor chip in the first cavity of the carrier comprises placing the first semiconductor chip on a base surface of the first cavity, wherein the main surface of the carrier overlaps a portion of the base surface of the first cavity.

19. A method, comprising:
    providing a carrier having a cavity formed in a main surface of the carrier, wherein an angle formed between the main surface of the carrier and a side wall of the cavity has a value between 60° and 85°;
    placing a semiconductor chip in the cavity of the carrier;
    laminating a dielectric foil over the carrier and the semiconductor chip; and
    applying a metal layer over the dielectric foil such that the dielectric foil insulates the metal layer from the semiconductor chip upon applying the metal layer.

20. A method, comprising:
    providing a metal carrier with a cavity in a main surface of the metal carrier, wherein the main surface of the metal carrier overlapping portions of a base surface of the cavity, and wherein an angle formed between the main surface of the metal carrier and a side wall of the cavity has a value between 60° and 85°;
    locating a semiconductor chip on the base surface of the cavity in the metal carrier with a first surface of the semiconductor chip facing the base surface, the semiconductor chip comprising a first electrode on the first surface and a second electrode on a second surface opposite to the first surface;
    forming a dielectric layer over the semiconductor chip and the carrier; and
    forming external contact elements over the dielectric layer, wherein the external contact elements are electrically coupled to the first electrode and second electrode of the semiconductor chip.

21. A method, comprising:
    providing a carrier having a first cavity formed in a main surface of the carrier, wherein an angle formed between the main surface of the carrier and a side wall of the first cavity has a value between 60° and 85°;
    providing a dielectric foil with a metal layer attached to the dielectric foil, wherein the dielectric foil with the metal layer attached to the dielectric foil is a resin-coated-copper (RCC) foil;
    placing a first semiconductor chip in the first cavity of the carrier; and
    applying the dielectric foil to the carrier.

* * * * *